United States Patent
Tseng et al.

(10) Patent No.: US 9,257,571 B1
(45) Date of Patent: Feb. 9, 2016

(54) MEMORY GATE FIRST APPROACH TO FORMING A SPLIT GATE FLASH MEMORY CELL DEVICE

(71) Applicant: Taiwan Semiconductor Manufacturing Co., Ltd., Hsin-Chu (TW)

(72) Inventors: Yuan-Tai Tseng, Zhubei (TW); Yu-Hsing Chang, Taipei (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/477,911

(22) Filed: Sep. 5, 2014

(51) Int. Cl.
| | |
|---|---|
| H01L 27/11 | (2006.01) |
| H01L 29/792 | (2006.01) |
| H01L 29/51 | (2006.01) |
| H01L 29/423 | (2006.01) |
| H01L 29/66 | (2006.01) |
| H01L 21/28 | (2006.01) |
| H01L 21/311 | (2006.01) |
| H01L 21/3213 | (2006.01) |

(52) U.S. Cl.
CPC ........ *H01L 29/792* (2013.01); *H01L 21/28282* (2013.01); *H01L 21/31111* (2013.01); *H01L 21/32133* (2013.01); *H01L 29/42344* (2013.01); *H01L 29/42348* (2013.01); *H01L 29/511* (2013.01); *H01L 29/518* (2013.01); *H01L 29/66833* (2013.01)

(58) Field of Classification Search
CPC ............ H01L 27/115; H01L 27/11521; H01L 27/28273; H01L 27/11568; H01L 29/792; H01L 29/66833; H01L 21/28282
USPC ........................................................ 257/314
See application file for complete search history.

(56) References Cited

U.S. PATENT DOCUMENTS

| | | | | |
|---|---|---|---|---|
| 2005/0224858 | A1* | 10/2005 | Hung et al. | 257/314 |
| 2005/0230736 | A1* | 10/2005 | Ishimaru et al. | 257/314 |
| 2008/0175053 | A1* | 7/2008 | Lue et al. | 365/185.05 |

* cited by examiner

*Primary Examiner* — Monica D Harrison
(74) *Attorney, Agent, or Firm* — Eschweller & Associates, LLC

(57) ABSTRACT

A split gate flash memory cell device with a line-shaped charge trapping dielectric structure is provided. A semiconductor substrate includes a first source/drain region and a second source/drain region. A select gate and a memory gate are spaced over the semiconductor substrate between the first and second source/drain regions. A line-shaped charge trapping dielectric structure is arranged between the semiconductor substrate and the memory gate. A method for manufacturing the split gate flash memory cell device is also provided.

20 Claims, 11 Drawing Sheets

MEMORY GATE FIRST APPROACH TO FORMING A SPLIT GATE FLASH MEMORY CELL DEVICE

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cell devices. Common types of flash memory cell devices include stacked gate memory cell devices and split gate memory cell devices. Split gate flash memory cell devices have several advantages over stacked gate memory cell devices, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
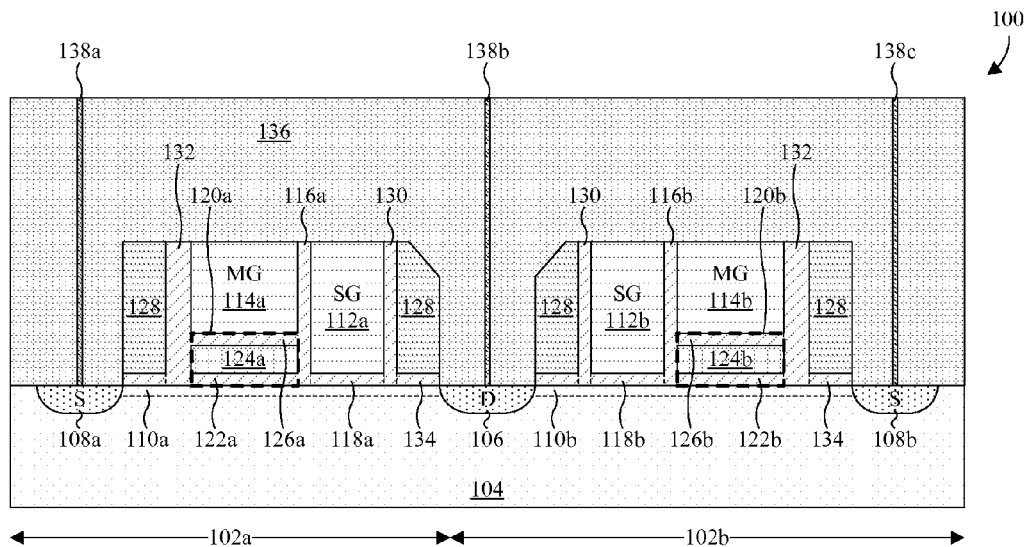
FIG. 1 illustrates a cross-sectional view of some embodiments of a pair of split gate flash memory cell devices with linear charge trapping dielectric structures.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Common types of split gate flash memory cell devices include silicon-oxide-nitride-oxide-silicon (SONOS) split gate flash memory cell devices and metal-oxide-nitride-oxide-silicon (MONOS) split gate flash memory cell devices. A SONOS or MONOS split gate flash memory cell device includes a memory gate and a select gate spaced over a top surface of a semiconductor substrate. For a SONOS split gate flash memory cell device, the memory gate is formed from a silicon based material, such as polysilicon, and for a MONOS split gate flash memory cell device, the memory gate is formed from a metal or metal alloy. Arranged between the select gate and the semiconductor substrate, a select gate dielectric structure provides electrical isolation. Arranged between neighboring sidewalls of the memory gate and the select gate, and extending under the memory gate between the semiconductor substrate and the memory gate, a non-linear, L-shaped charge trapping dielectric structure provides electrical isolation. The charge trapping dielectric structure stores a variable amount of charge representing a unit of data.

According to some methods to forming MONOS or SONOS split gate flash memory cell devices, first and second select gates are formed spaced over a semiconductor substrate with corresponding first and second select gate dielectric structures arranged between the select gates and the semiconductor substrate. A charge trapping dielectric layer is then conformally formed over the select gates and the semiconductor substrate. Further, memory gates corresponding to the select gates are formed over and laterally abutting the charge trapping dielectric layer outside a central region between the select gates. After forming the memory gates, charge trapping dielectric structures corresponding to the memory gates are formed from the charge trapping dielectric layer. The charge trapping dielectric structures are arranged between neighboring sidewalls of the memory and selects gates, and extend under the corresponding memory gates. Typically, the charge trapping dielectric structures are formed by performing an isotropic etch, such as a full wet etch or a wet-dry-wet etch, into the charge trapping dielectric layer for a period time sufficient to etch through the thickness of the charge trapping dielectric layer.

A challenge posed by forming the charge trapping dielectric structures with an isotropic etch pertains to over etching. Neither the thickness of the charge trapping dielectric layer nor the etch rate through the charge trapping dielectric layer are exactly uniform and/or known. Therefore, to ensure full removal of unneeded regions of the charge trapping dielectric layer, a margin is added to the time employed to etch through the thickness of the charge trapping dielectric layer. This margin can lead to over etching. Over etching, in turn, can lead to damage to the select or memory gates, and/or damage to the charge trapping dielectric structures or the select gate dielectric structures. For example, the select gates and/or the select gate dielectric structures can be undercut by over etching. As another example, the charge trapping dielectric structures and/or the memory gates can be undercut by over etching. Where over etching occurs, memory cell device failure and/or reduced performance (e.g., reduced data retention, switching speed, or energy efficiency, and/or increased leakage current) can occur. This challenge is exacerbated in 28 nanometer (nm) micro fabrications.

In view of the foregoing, the present disclosure is directed to improved methods to forming SONOS or MONOS memory cell devices, as well as the resulting semiconductor structures or integrated circuits of the memory cell devices.

According to the improved methods, the memory gates and the charge trapping dielectric structures are formed before the select gates. This advantageously eliminates the need to perform an isotropic etch for the removal of unneeded regions of the charge trapping dielectric layer during the formation of the charge trapping dielectric structures. As such, the select and memory gates, as well as the charge trapping dielectric structures and the select gate dielectric structures, advantageously remain damage free. Further, memory cell device failure is advantageously reduced, and memory cell device performance is advantageously improved. The semiconductor structures or integrated circuits resulting from performing the improved methods employ line-shaped charge trapping dielectric structures, as opposed to non-linear, L-shaped charge trapping dielectric structures.

With reference to FIG. 1, a cross-sectional view 100 of some embodiments of a semiconductor structure or integrated circuit for a pair of split gate flash memory cell devices 102a, 102b is provided. The pair includes a first split gate flash memory cell device 102a and a second split gate flash memory cell device 102b, and is arranged over and/or within a semiconductor substrate 104. The memory cell devices 102 store data in a nonvolatile manner and are, for example, MONOS or SONOS split gate flash memory cell devices. The semiconductor substrate 104 is, for example, a bulk substrate of silicon, germanium, or group III and group V elements. Alternatively, the semiconductor substrate 104 is, for example, a semiconductor-on-insulator (SOI) substrate.

Source/drain regions 106, 108a, 108b are embedded in a top surface of the semiconductor substrate 104 to define a channel region 110a, 110b for each of the memory cell devices 102. The channel regions 110 are regions of the semiconductor substrate 104 between the source/drain regions 106, 108 where inversion channels form. In some embodiments, the source/drain regions 106, 108 include a source/drain region 106 common to the memory cell devices 102, as well as source/drain regions 108 individual to the memory cell devices 102 arranged on opposite sides of the common source/drain region 106. The source/drain regions 106, 108 can, for example, be p- or n-type doped regions.

Over each of the channel regions 110, the memory cell device 102 of the channel region 110 includes a select gate 112a, 112b, a memory gate 114a, 114b, and an inter-gate spacer 116a, 116b, arranged between the source/drain regions 106, 108 of the channel region 110. The inter-gate spacer 116 is arranged between neighboring sidewalls of the select and memory gates 112, 114 to provide spacing and electrical isolation between the select and memory gates 112, 114. In some embodiments, the select gate 112 is arranged proximate to a common source/drain region 106, and the memory gate 114 is arranged proximate to an individual source/drain region 106. Where the memory cell device 102 is a SONOS memory cell device, the select and memory gates 112, 114 are typically polysilicon, and where the memory cell device 102 is a MONOS memory cell device, the select and memory gates 112, 114 are typically metal or metal alloys. The inter-gate spacer 116 is, or otherwise includes, a dielectric, such as silicon dioxide, silicon nitride, or silicon oxynitride.

Arranged between the select and memory gates 112, 114 and the semiconductor substrate 104, each of the memory cell devices 102 further includes a select gate dielectric structure 118a, 118b and a charge trapping dielectric structure 120a, 120b. The select gate dielectric structure 118 is arranged below the select gate 112 between the select gate 112 and the semiconductor substrate 104 to provide electrical isolation. The select gate dielectric structure 118 is or otherwise includes, for example, silicon dioxide, silicon nitride, or silicon oxynitride. The charge trapping dielectric structure 120 is arranged below the memory gate 114 between the memory gate 114 and the semiconductor substrate 104 to provide electrical isolation and data storage. The charge trapping dielectric structure 120 stores a variable amount of charge representing a unit of data, such as a bit of data. The variable amount of charge can be read and varied through selective biasing of the memory gate 114. The charge trapping dielectric structure 120 is linear and extends between opposing sidewalls of the memory gate 114. Further, the charge trapping dielectric structure 120 includes a bottom, tunneling structure 122a, 122b, a middle, charge storage structure 124a, 124b, and a top, memory gate dielectric structure 126a, 126b. The top and bottom structure 122, 126 are or otherwise include, for example, a dielectric, such as silicon dioxide. The middle, charge storage structure 124a, 124b is or otherwise includes, for example, silicon nitride or silicon dot nanocrystals. The dots of the silicon dot nanocrystals have, for example, diameters of about 10-200 nanometers.

A sidewall structure 128 is arranged along sidewalls of the memory cell devices 102. A select gate spacer 130 is arranged between sidewalls of the select gates 112 and the sidewall structure 128, and a memory gate spacer 132 is arranged between sidewalls of the memory gates 114 and the sidewall structure 128, to provide spacing and electrical isolation. Further, a sidewall dielectric structure 134 is arranged below the sidewall structure 128 between the sidewall structure 128 and the semiconductor substrate 104 to provide electrical isolation. In some embodiments, the thicknesses of the memory gate spacer 132 and the select gate spacer 130 are different. For example, the thickness of the memory gate spacer 132 is greater or less than the thickness of the select gate spacer 130. The select gate and memory gate spacers 130, 132, the sidewall dielectric structure 134, and the sidewall structure 128 are or otherwise include, for example, silicon dioxide, silicon nitride, or silicon oxynitride. In some embodiments, the select gate and memory gate spacers 130, 132, as well as the sidewall dielectric structure 134, are silicon dioxide, and the sidewall structure 128 is silicon nitride.

An interlayer dielectric (ILD) structure 136 is arranged over and surrounding the memory cell devices 102. Further, conductive contacts 138a-c corresponding to the source/drain regions 106, 108 extend through the ILD structure 136 to the corresponding source/drain regions 106, 108. The ILD structure 136 is or otherwise includes, for example, an extreme low-K dielectric (i.e., a dielectric with a dielectric constant κ less than 2). The conductive contacts 138 are or otherwise include, for example, a metal, such as tungsten, copper, aluminum, gold, or silver, or polysilicon.

In operation, each of the memory cell devices 102 stores a variable amount of charge, such as electrons, in the charge trapping dielectric structure 120 of the memory cell device 102. The charge is advantageously stored in a non-volatile manner so that the stored charge persists in the absence of power. The amount of charge stored in the charge trapping dielectric structure 120 represents a value, such as binary value, and is varied through program (i.e., write), read, and erase operations. These operations are performed through selective biasing of the select gate 112 and the memory gate 114 of the memory cell device 102.

During a program or erase operation of one of the memory cell devices 102, the memory gate 114 of the memory cell device 102 is forward or reversed biased with a high (e.g., at least an order of magnitude higher) voltage relative a voltage applied across the channel region 110 of the memory cell device 102 and/or relative to a voltage applied to the select gate 112 of the memory cell device 102. In some embodiments, forward biasing is used for a program operation, and reverse biasing is used for an erase operation. During a program operation, the high bias voltage promotes Fowler-Nordheim tunneling of carriers from the channel region 110 towards the memory gate 114. As the carriers tunnel towards the memory gate 114, the carriers become trapped in the charge trapping dielectric structure 120 of the memory cell device 102. During an erase operation, the high bias voltage promotes Fowler-Nordheim tunneling of carriers in the charge trapping dielectric structure 120 away from the memory gate 114. As the carriers tunnel away from the memory gate 114, the carriers become dislodged or otherwise removed from the charge trapping dielectric structure 120.

Charge stored in the charge trapping dielectric structure 120 of one of the memory cell devices 102 screens an electric field formed between the memory gate 114 of the memory cell device 102 and the channel region 110 of the memory cell device 102 when the memory gate 114 is biased. This has an effect of increasing the threshold voltage $V_{th}$ of the memory cell device 102 by an amount $\Delta V_{th}$. During a read operation, a voltage is applied to the select gate 112 of the memory cell device 102 to induce part of the channel region 110 to conduct. Application of a voltage to the select gate 112 attracts carriers to part of the channel region 110 adjacent to the select gate 112. Further, a voltage greater than $V_{th}$, but less than $V_{th}+\Delta V_{th}$, is applied to the memory gate 114. If the memory cell device 102 turns on (i.e., allows charge to flow), then it stores a first data state (e.g., a logical "0"). If the memory cell device 102 does not turn on, then it stores a second data state (e.g., a logical "1").

Figure 2:
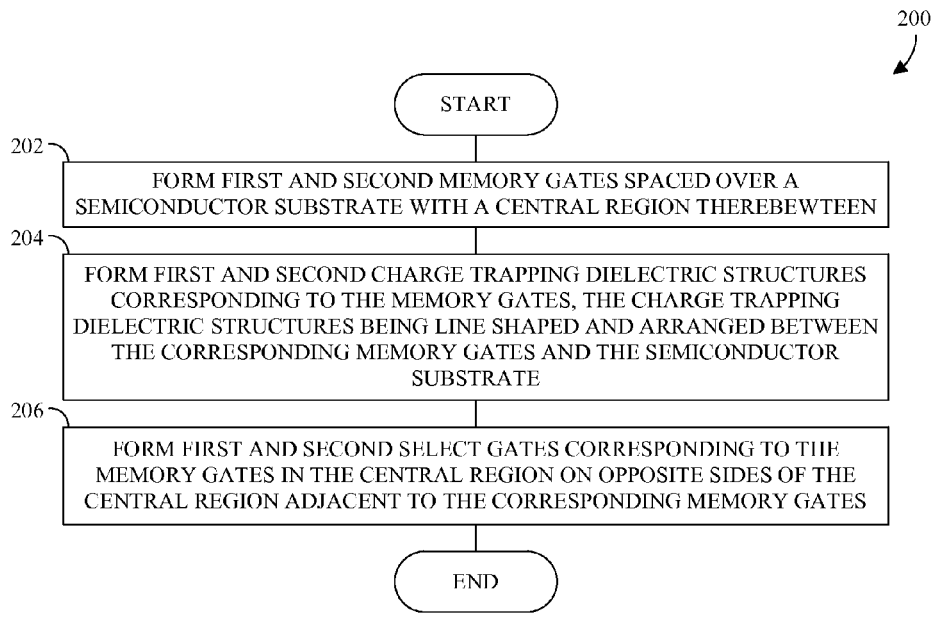
FIG. 2 illustrates a flow chart of some embodiments of a method for manufacturing a pair of split gate flash memory cell devices with linear charge trapping dielectric structures.

With reference to FIG. 2, a flow chart 200 provides some embodiments of a method for manufacturing a semiconductor structure or integrated circuit for a pair of split gate flash memory cells with linear charge trapping dielectric structures. An example of the semiconductor structure or integrated is shown in FIG. 1.

First and second memory gates are formed (Action 202) spaced over a semiconductor substrate with a central region therebetween.

First and second charge trapping dielectric structures corresponding to the memory gates are formed (Action 204). The charge trapping dielectric structures are line shaped and extend between opposing sidewalls of the corresponding memory gates. Further, the charge trapping dielectric structures are arranged between the corresponding memory gates and the semiconductor substrate.

First and second select gates corresponding to the memory gates are formed (Action 206) in the central region on opposite sides of the central region adjacent to the corresponding memory gates.

As described above, traditional approaches to forming split gate flash memory cell devices formed charge trapping dielectric structures after forming memory gates, which were formed after forming select gates. In forming the charge trapping dielectric structures, an isotropic etch, such as a full wet etch or a wet-dry-wet etch, was performed into a charge trapping dielectric layer for a period time sufficient to etch through the thickness of the charge trapping dielectric layer. This isotropic etch, in turn, could lead to over etching and damage to the memory cell devices. For example, the select gates could be undercut.

The present disclosure addresses the foregoing challenge by forming the select gates after the memory gates, which advantageously eliminates the need to perform an isotropic etch for the removal of unneeded regions of the charge trapping dielectric layer during the formation of the charge trapping dielectric structures. As such, the select and memory gates, as well as the charge trapping dielectric structures, remain damage free. There is no undercutting, and memory cell device failure is reduced while memory cell device performance is improved.

With reference to FIGS. 3-21, cross-sectional views of some embodiments of a semiconductor structure or integrated circuit at various stages of manufacture are provided to illustrate the method. Although FIGS. 3-21 are described in relation to the method, it will be appreciated that the structures disclosed in FIGS. 3-21 are not limited to the method, but instead may stand alone as structures independent of the method. Similarly, although the method is described in relation to FIGS. 3-21, it will be appreciated that the method is not limited to the structures disclosed in FIGS. 3-21, but instead may stand alone independent of the structures disclosed in FIGS. 3-21.

FIGS. 3-7 illustrate cross-sectional views 300, 400, 500, 600 and 700 of some embodiments corresponding to Actions 202 and 204.

Figure 3:
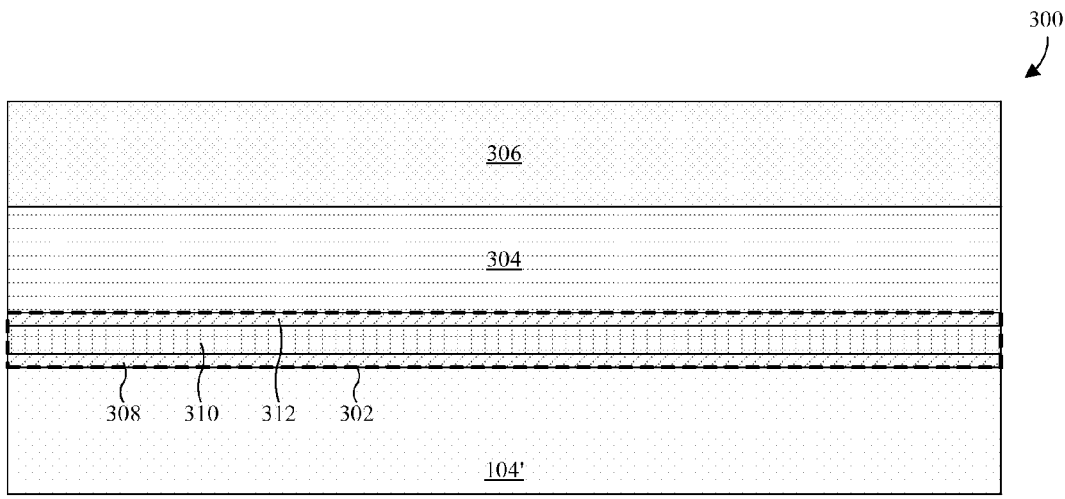
FIGS. 3-21 illustrate a series of cross-sectional views of some embodiments of a pair of split gate flash memory cell devices at various stages of manufacture, the split gate flash memory cell devices having linear charge trapping dielectric structures.

A shown by FIG. 3, a semiconductor substrate 104' is provided. The semiconductor substrate 104' is, for example, a bulk substrate of silicon, germanium, or group III and group V elements. Alternatively, the semiconductor substrate 104' is, for example, a semiconductor-on-insulator (SOI) substrate.

Also shown by FIG. 3, a charge trapping dielectric layer 302, a memory gate layer 304, and a hard mask layer 306 are formed in that order over the semiconductor substrate 104'. The charge trapping dielectric layer 302, the memory gate dielectric layer 304, and the hard mask layer 306 are typically uniform or approximately uniform in thickness. The memory gate layer 304 is or otherwise includes, for example, polysilicon or metal, such as copper, aluminum, tungsten, gold, silver, or nickel. The hard mask layer 306 is or otherwise includes, for example, silicon nitride. The charge trapping layer 302 includes a bottom, tunneling layer 308, a middle, charge storage layer 310, and a top, memory gate dielectric layer 312. The top and bottom layers 308, 312 are or otherwise include, for example, a dielectric, such as silicon dioxide. The middle, charge storage layer 310 is or otherwise includes, for example, silicon nitride or silicon dot nanocrystals. The dots of the silicon dot nanocrystals have, for example, diameters of about 10-200 nanometers.

Figure 4:
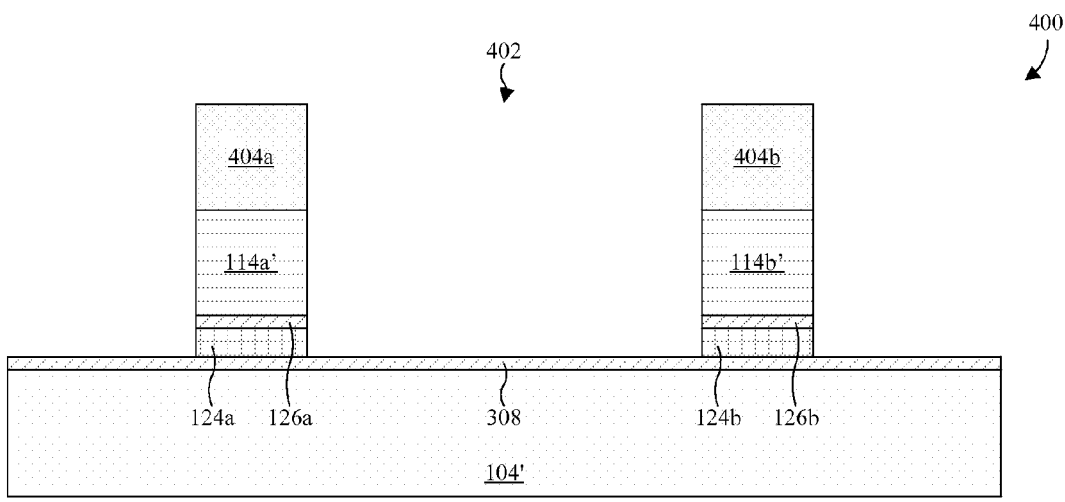

As shown by FIG. 4, a first etch is performed through select regions of the memory gate dielectric layer 312, the charge storage layer 310, the memory gate layer 304, and the hard mask layer 306 to the tunneling layer 308. The resulting semiconductor structure includes first and second memory gates 114a', 114b' spaced over the semiconductor substrate with a central region 402 therebetween and corresponding hard masks 304a, 304b arranged thereover. Further, the resulting semiconductor structure includes line-shaped memory gate dielectric structures 126a, 126b and line-shaped charge storage structures 124a, 124b, corresponding to the first and second memory gates 114' and arranged between the corresponding memory gates 114' and the tunneling layer 308. In some embodiments, the first etch includes forming a first photoresist layer over a top surface of the hard mask layer 306, patterning the first photoresist layer, and applying an etchant to the patterned first photoresist layer.

Figure 5:
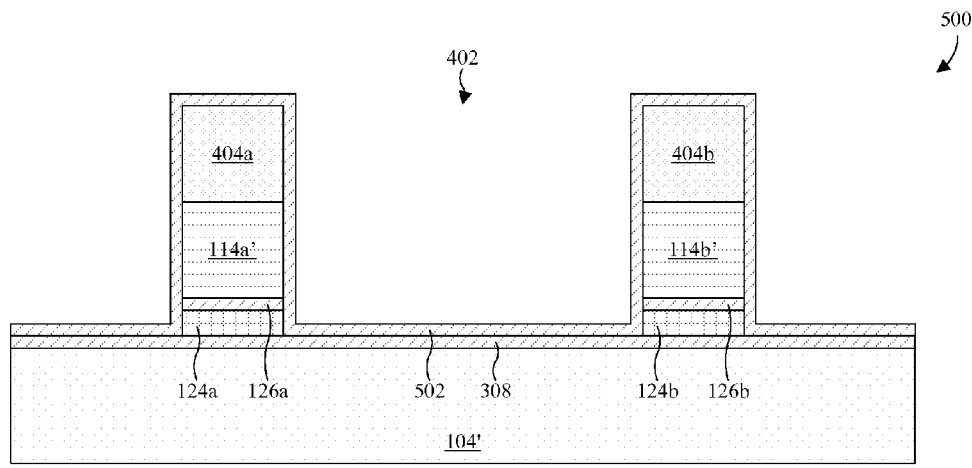

As shown by FIG. 5, a first spacer layer 502 is conformally formed over top surfaces of the tunneling layer 308 and the hard masks 404, as well as along sidewall of the hard masks 404, the memory gates 114', the memory gate dielectric structures 126, and the charge storage structures 124. The first spacer layer 502 is or otherwise includes, for example, a dielectric, such as silicon dioxide, silicon nitride, or silicon oxynitride.

Figure 6:
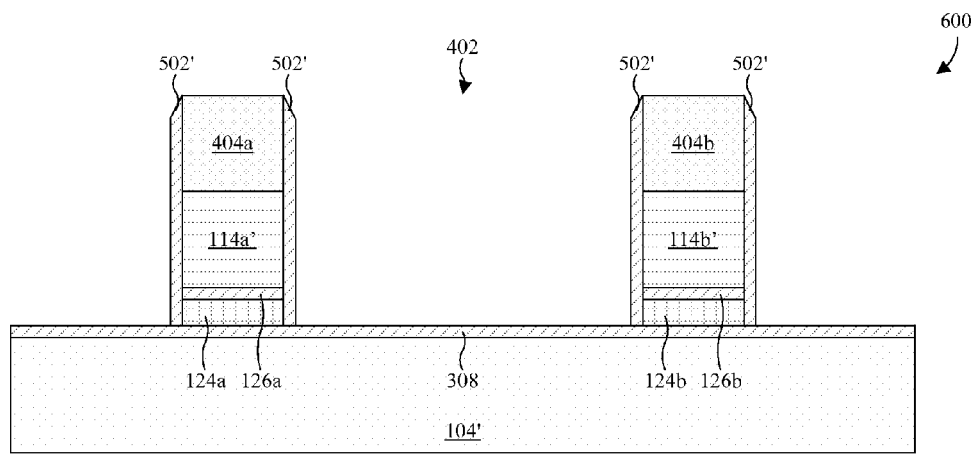

As shown by FIG. 6, a second etch is performed through select regions of the first spacer layer 502 to remove horizontal stretches of the first spacer layer 502 while leaving vertical stretches of the first spacer layer 502 lining sidewalls. For example, an etchant is applied to the first spacer layer 502 for the approximate time needed to etch through the thickness of the first spacer layer 502, while the hard masks 404 protect layers therebelow.

Figure 7:
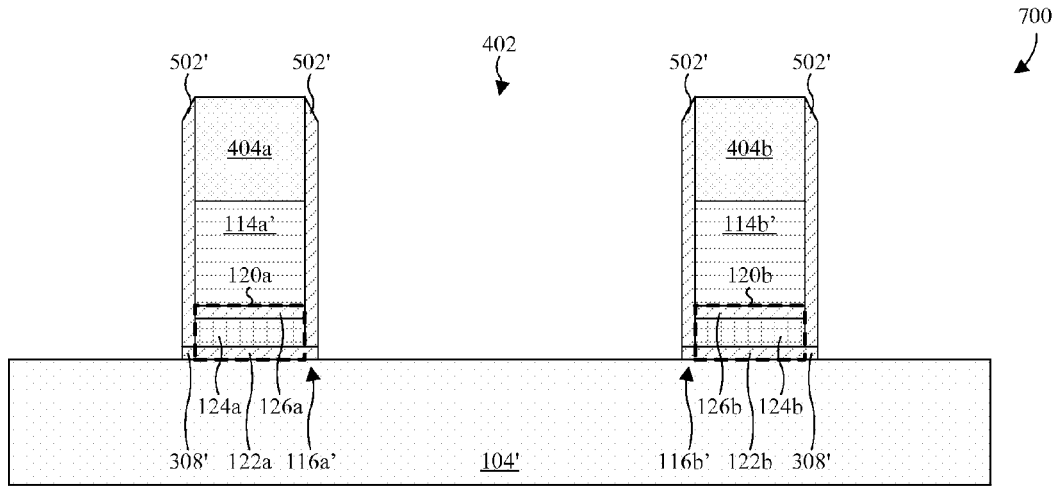

As by FIG. 7, a third etch is performed through select regions of the tunneling layer 308 to the semiconductor substrate 104'. These select regions include exposed regions of the tunneling layer 308. For example, an etchant is applied to the tunneling layer 308 for the approximate time needed to etch through the thickness of the tunneling layer 308, while the hard masks 404 protect layers therebelow. In some embodiments, the second and third etches are performed as part of the same etching process.

The resulting semiconductor structure includes inter-gate spacers 116a', 116b' corresponding to the memory gates 114' in the central region 402 on opposite sides of the central region 402 adjacent to the corresponding memory gates 114'. The inter-gate spacers 116' include regions of the remaining first spacer layer 502' in the central region 402, along with regions of the remaining tunneling layer 308' overwhich these remaining first spacer layer regions rest.

The resulting semiconductor structure further includes tunneling structures 122a, 122b and charge trapping dielectric structures 120a, 120b. The tunneling structures 122 correspond to the memory gates 114' and are those regions of the remaining tunneling layer 308' overwhich the corresponding memory gates 114' are arranged. The charge trapping dielectric structures 120 also correspond to the memory gates 114' and include the tunneling structures 122, the charge storage structures 124 and the memory gate dielectric structures 126, of the corresponding memory gates 114'.

Figure 8:
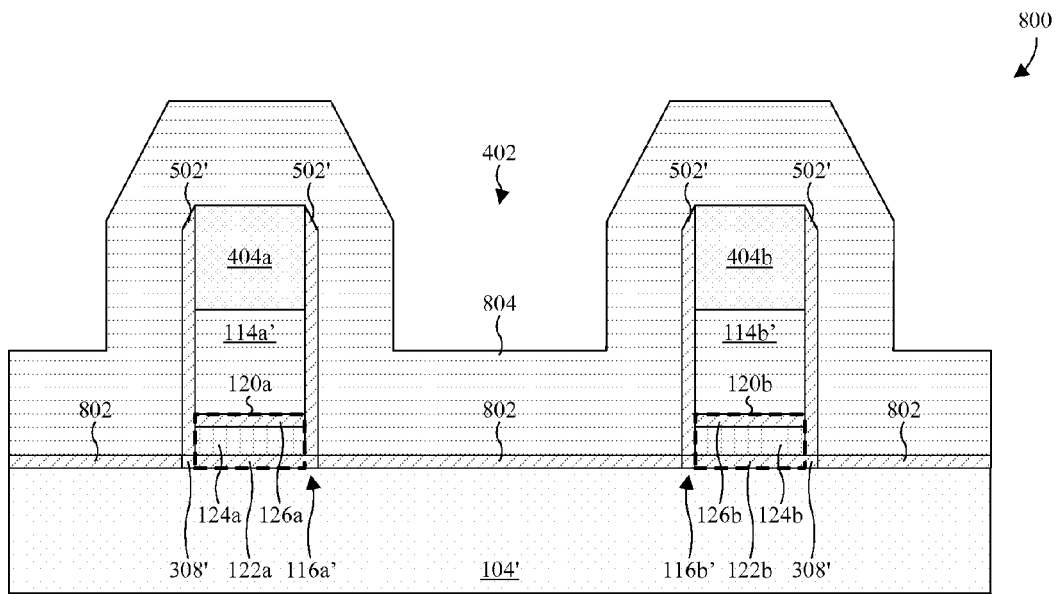
Figure 9:
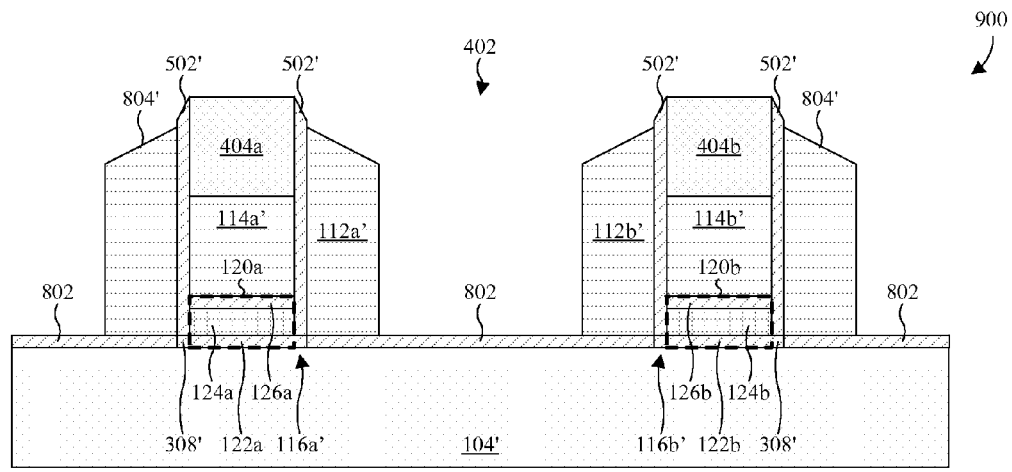
Figure 10:
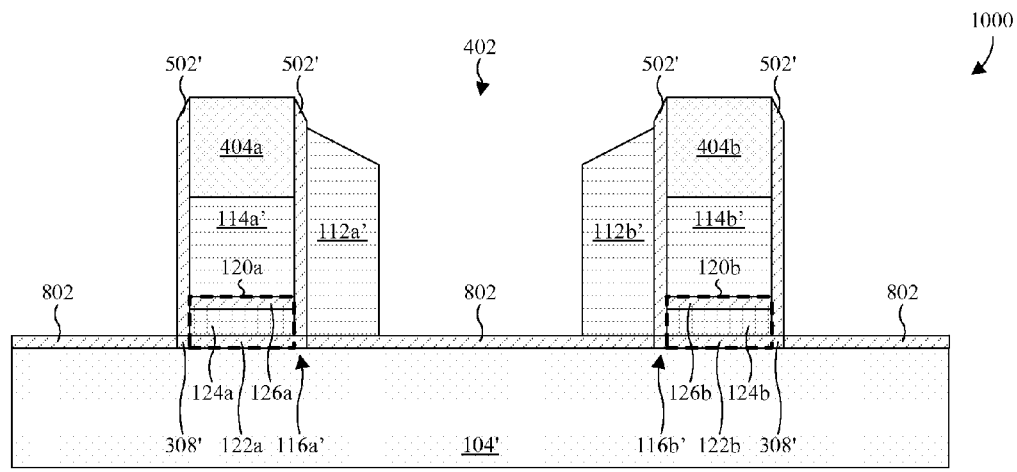

FIGS. 8-10 illustrate cross-sectional views 800, 900 and 1000 of some embodiments corresponding to Action 206.

As shown by FIG. 8, a select gate dielectric layer 802 is formed over exposed regions of the semiconductor substrate 104', and a select gate layer 804 is conformally formed over the select gate dielectric layer 802, the remaining first spacer layer 502', and the hard masks 404. The select gate dielectric layer 802 and the select gate layer 804 are typically uniform or approximately uniform in thickness. The select gate dielectric layer 802 is or otherwise includes, for example, a dielectric, such as silicon dioxide, silicon nitride, or silicon oxynitride. The select gate layer 804 is or otherwise includes, for example, polysilicon or metal, such as copper, aluminum, tungsten, gold, silver, or nickel.

As shown by FIG. 9, a fourth etch is performed through select regions of the select gate layer 804 to remove horizontal stretches of the select gate layer 804 while leaving vertical stretches of the select gate layer 804 lining sidewalls. For example, an etchant is applied to the select gate layer 804 for the approximate time needed to etch through the thickness of the select gate layer 804, while the hard masks 404 protect layers therebelow. The remaining select gate layer 804' after performing the fourth etch includes select gates 112a', 112b' corresponding to the memory gates 114' in the central region 402 on opposite sides of the central region 402 adjacent to the corresponding memory gates 114'.

As shown by FIG. 10, a fifth etch is performed through select regions of the remaining select gate layer 804' to remove regions outside the central region 402. In some embodiments, the fifth etch includes forming a second photoresist layer covering the central region 402, patterning the second photoresist layer, and applying an etchant to the patterned second photoresist layer.

FIGS. 11-21 illustrate cross-sectional views 1100, 1200, 1300, 1400, 1500, 1600, 1700, 1800, 1900, 2000, 2100 of some embodiments corresponding to actions performed after the method.

Figure 11:
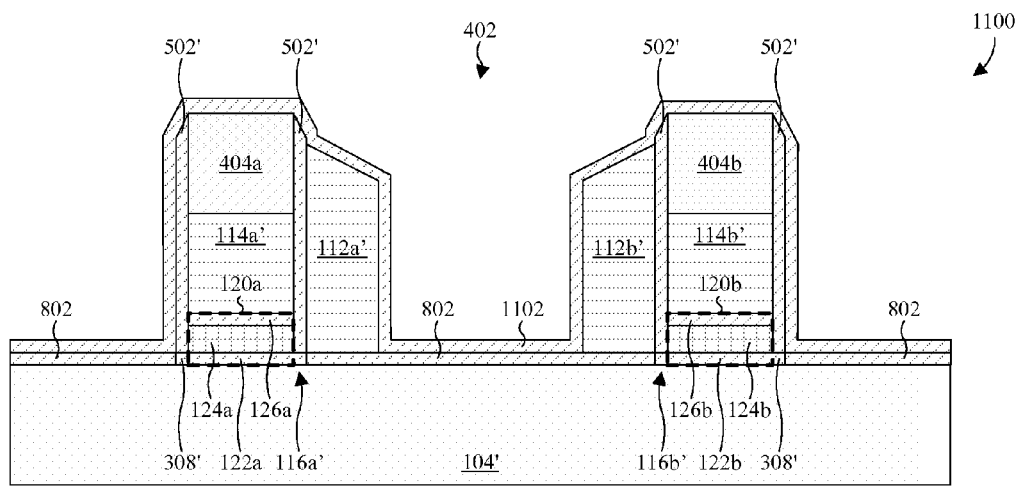

As shown by FIG. 11, a second spacer layer 1102 is conformally formed over the select gate dielectric layer 802, the remaining first spacer layer 502', the hard masks 404, and the select gates 112'. The second spacer layer 1102 is typically uniform or approximately uniform in thickness. The second spacer layer 1102 is or otherwise includes, for example, a dielectric, such as silicon dioxide, silicon nitride, or silicon oxynitride.

Figure 12:
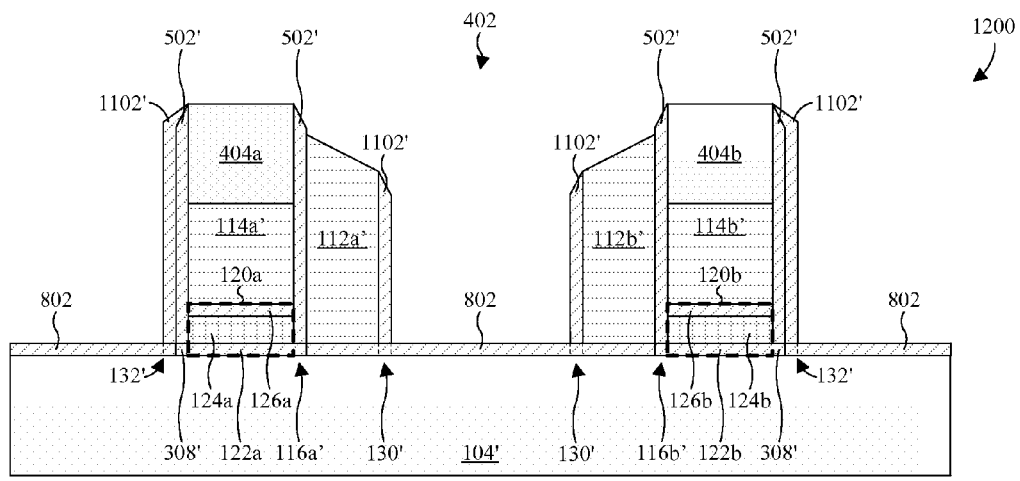

As shown by FIG. 12, a sixth etch is performed through select regions of second spacer layer 1102 to remove horizontal stretches of the second spacer layer 1102 while leaving vertical stretches of the second spacer layer 1102 lining sidewalls. For example, an etchant is applied to the second spacer layer 1102 for the approximate time needed to etch through the thickness of the second spacer layer 1102, while the hard masks 404 protect layers therebelow.

The resulting semiconductor structure includes a memory gate spacer 132' lining sidewalls of the memory gates 114' on opposite sides of the memory gates 114' as the select gates 112'. The memory gate spacer 132' includes regions of the remaining first spacer layer 502' on opposite sides of the memory gates 114' as the select gates 112', regions of the remaining tunneling layer 308' overwhich these remaining first spacer layer regions rest, regions of the second remaining spacer layer 1102' on opposite sides of the memory gates 114' as the select gates 112', and regions of the select gate dielectric layer 802 overwhich these remaining second spacer layer regions rest.

The resulting semiconductor structure further includes a select gate spacer 130' lining sidewalls of the select gates 112' on opposite sides of the select gates 112' as the memory gates 114'. The select gate spacer 130' includes regions of the regions of the second remaining spacer layer 1102' on opposite sides of the select gates 112' as the memory gates 114', and regions of the select gate dielectric layer 802 overwhich these remaining second spacer layer regions rest.

Figure 13:
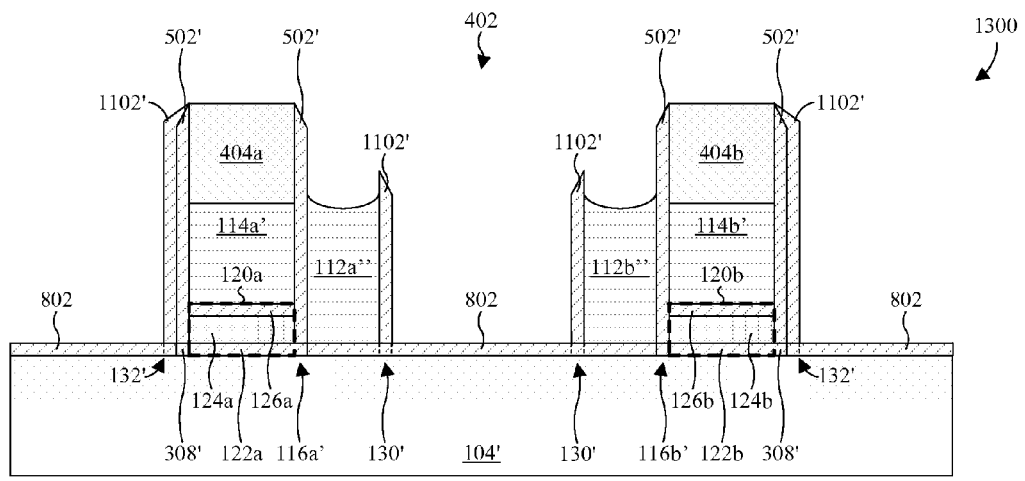

As shown by FIG. 13, a seventh etch is performed into the select gates 112' to recess the top surfaces of the select gates 112' relative to top surfaces of the neighboring select gate spacer 130' and the neighboring inter-gate spacers 116'. For example, an etchant is applied to the select gates 112' for a predetermined period of time, while the hard masks 404 protect layers therebelow.

Figure 14:
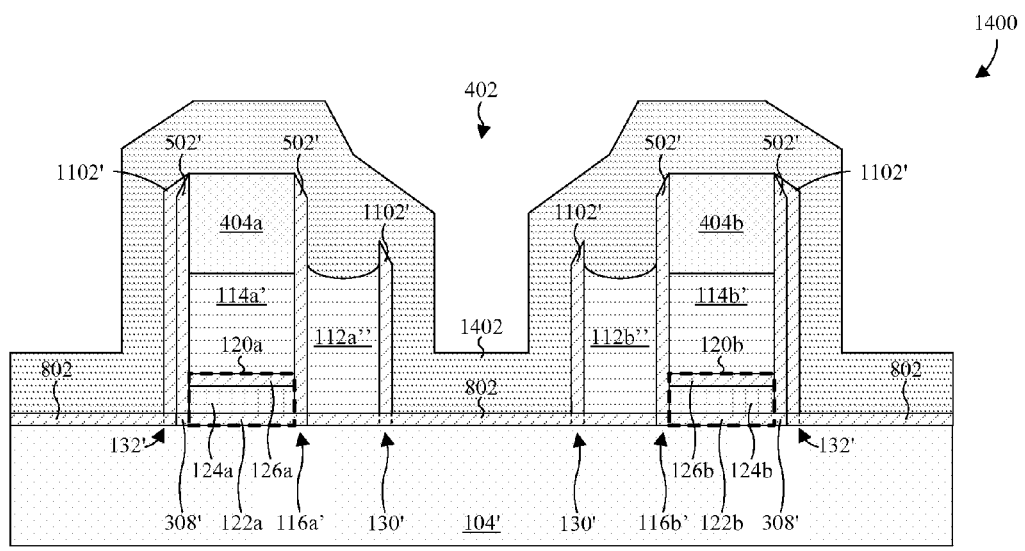

As shown by FIG. 14, a sidewall layer 1402 is conformally formed over the select gate dielectric layer 802, the remaining first and second spacer layers 502', 1102', the hard masks 404, and the remaining select gates 112a'', 112b''. The sidewall layer 1402 is or otherwise includes a dielectric, such as, for example, silicon dioxide, silicon nitride, or silicon oxynitride.

Figure 15:
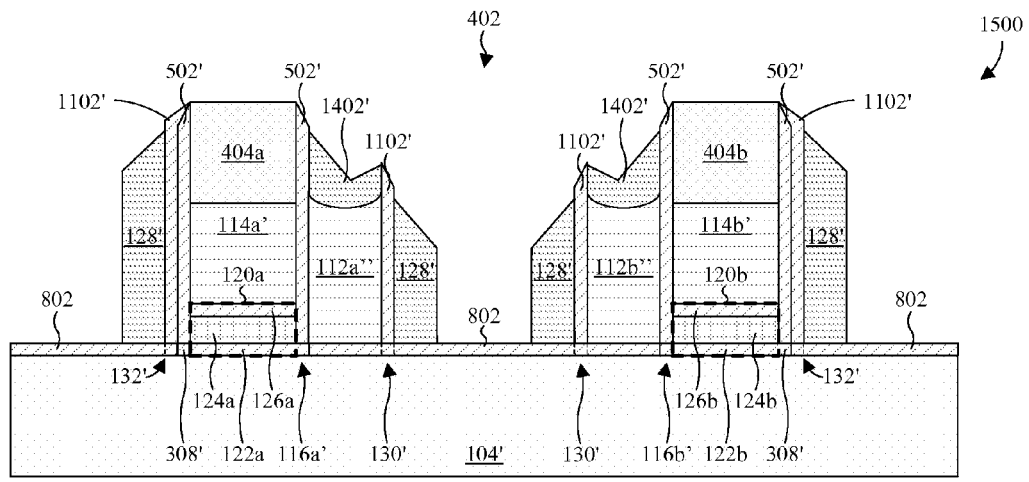

As shown by FIG. 15, an eighth etch is performed into the sidewall layer 1402 to remove horizontal stretches of the sidewall layer 1402 while leaving vertical stretches of the sidewall layer 1402 lining sidewalls. The remaining sidewall layer 1402' includes a sidewall structure 128' along sidewalls of the memory and select gate spacers 130', 132'. The eighth etch can be performed by, for example, applying an etchant to the sidewall layer 1402 for the approximate time needed to etch through the thickness of the sidewall layer 1402, while the hard masks 404 protect layers therebelow.

Figure 16:
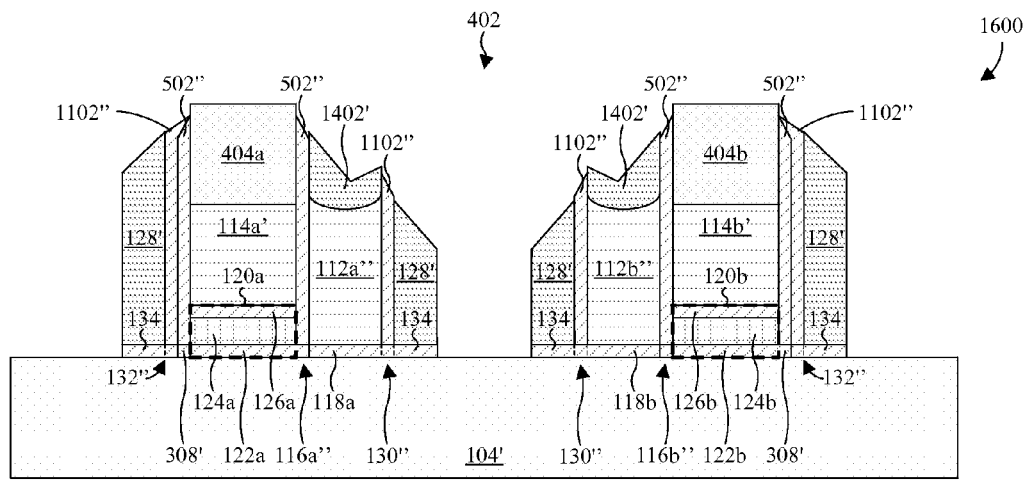
Figure 17:
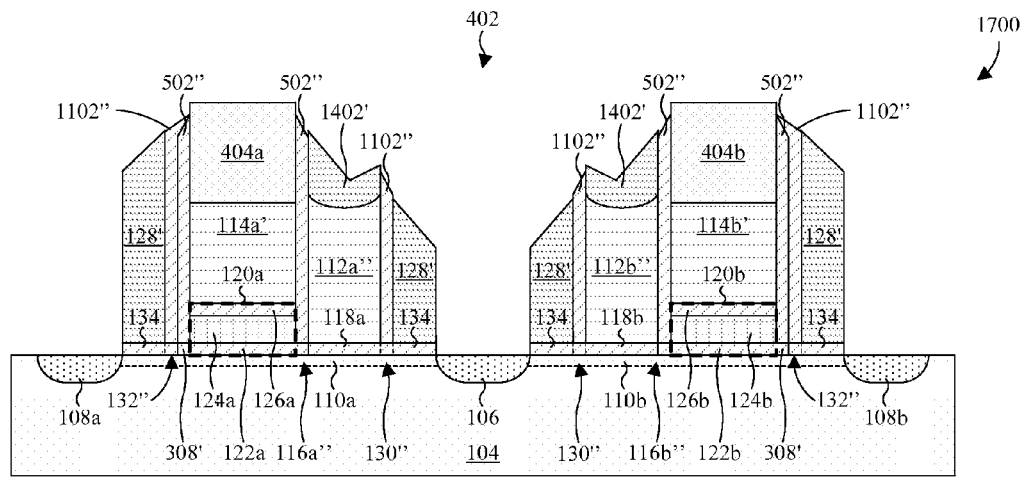

As shown by FIG. 16, an ninth etch is performed into the select gate dielectric layer 802 to remove exposed regions and expose the semiconductor substrate 104'. The remaining select gate dielectric layer 802' includes a sidewall dielectric structure 134 arranged between the sidewall structure 128' and the semiconductor substrate 104. Further, the remaining select gate dielectric layer 802' includes select gate dielectric structures 118a, 118b corresponding to the select gates 112" and arranged between the corresponding select gates 112" and the semiconductor substrate 104'. In some embodiments, performance of the ninth etch also recesses the select and memory gate spacers 130', 132', the inter-gate spacers 116', and the remaining first and second spacer layers 502', 1102'. The ninth etch can be performed by, for example, applying an etchant to the select gate dielectric layer 802 for the approximate time needed to etch through the thickness of the select gate dielectric layer 802, while the hard masks 404 protect layers therebelow As shown by FIG. 17, source/drain regions 106, 108a, 108b are embedded within the semiconductor substrate 104' to define channel regions 110a, 110b. This includes embedding a source/drain region 106 in the central region 402, as well as source/drain regions 108 outside the central region 402 adjacent to corresponding memory gates 114'.

Figure 18:
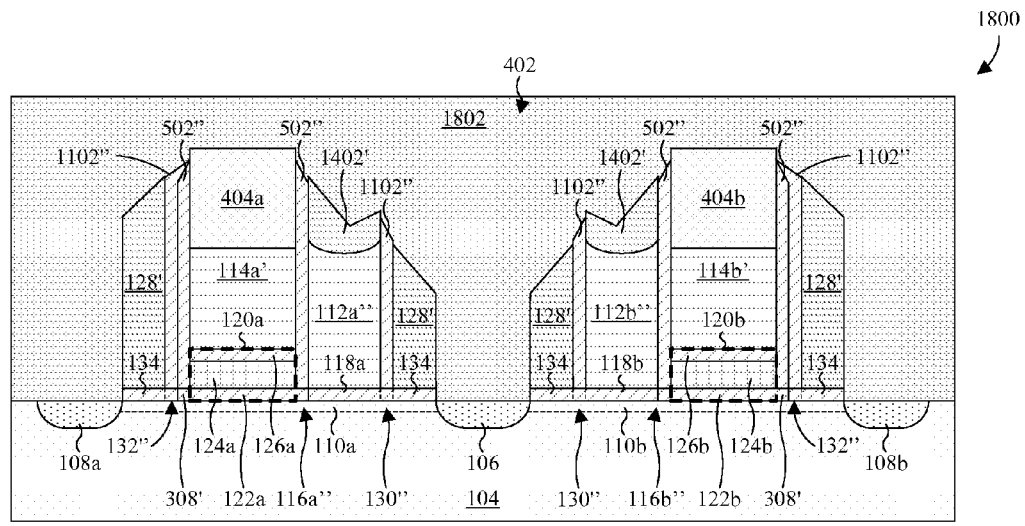

As shown by FIG. 18, a first ILD layer 1802 is formed over and surrounding the semiconductor structure, including the modified semiconductor substrate 104, the remaining first and second spacer layers 502", 1102", the select and memory gate spacers 130", 132", and the remaining inter-gate spacers 116a", 116b". The first ILD layer 1802 is or otherwise includes, for example, an extreme low-K dielectric.

Figure 19:
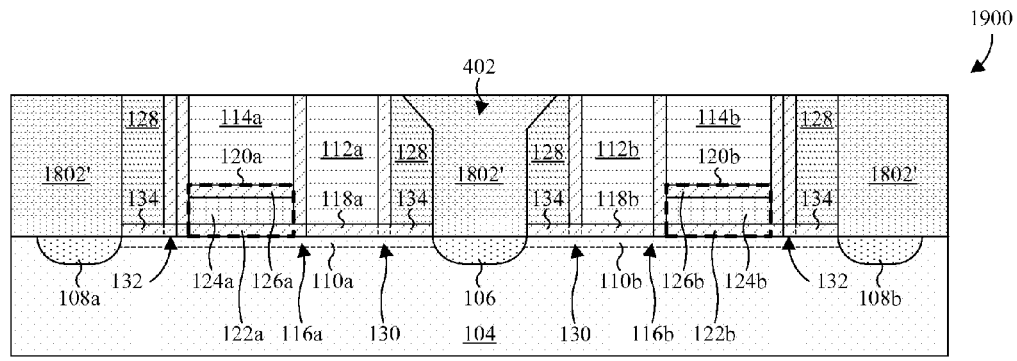

As shown by FIG. 19, a planarization is performed into the first ILD layer 1802 to the memory gates 114' to remove the hard masks 404. In some embodiments, the planarization further extends into the memory gates 114'. The planarization can be performed by, for example, a chemical-mechanical planarization (CMP).

Figure 20:
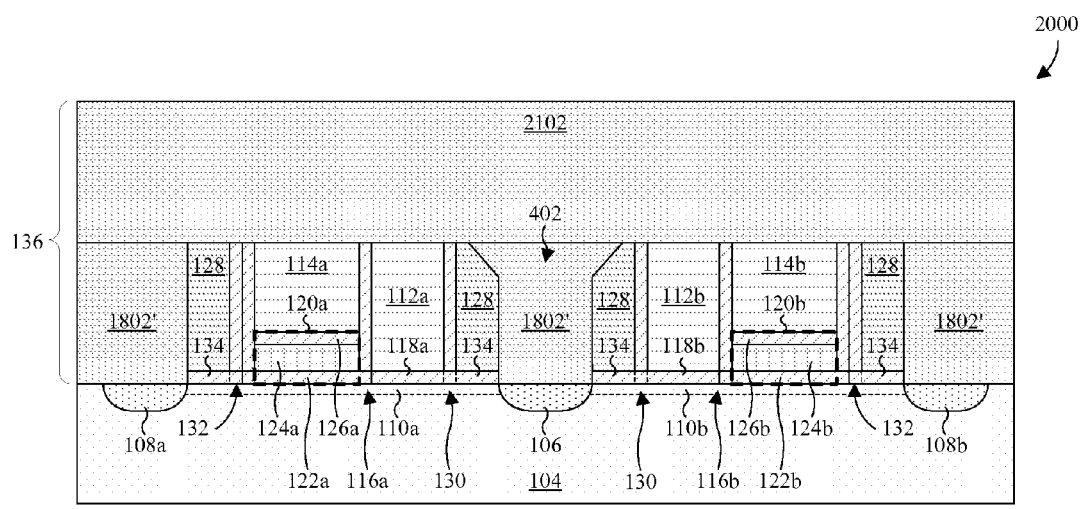

As shown by FIG. 20, a second ILD layer 2002 is formed over the semiconductor structure, including the remaining first ILD layer 1802'. The second ILD layer 2002 is or otherwise includes, for example, an extreme low-K dielectric. Further, the second ILD layer 2002 and the remaining first ILD layer 1802' collectively define an ILD structure 136.

Figure 21:
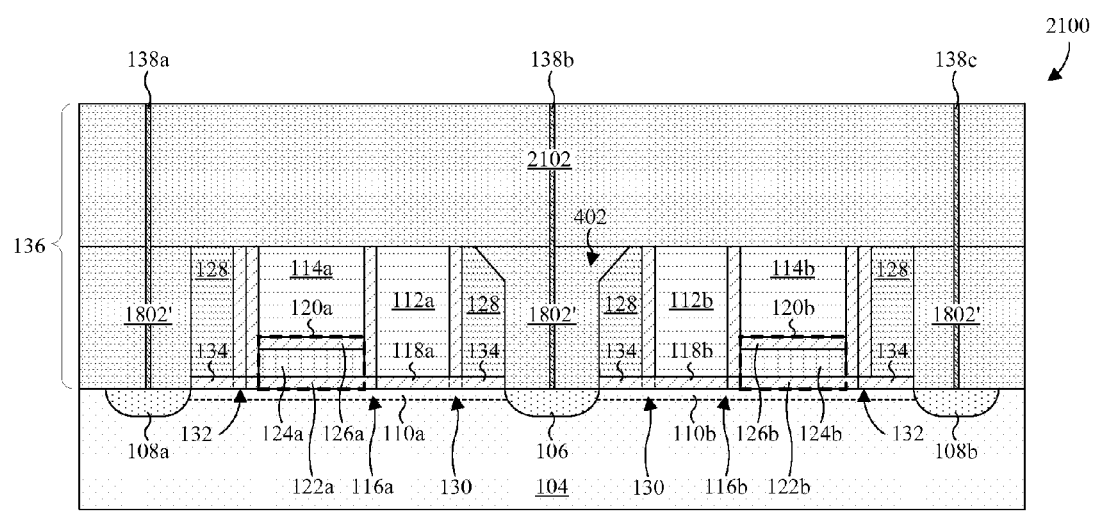

As shown by FIG. 21, conductive contacts 138a-c are formed extending through the ILD structure 136 to the source/drain regions 106, 108. The conductive contacts 138 are or otherwise include, for example, a metal, such as tungsten, copper, aluminum, gold, or silver, or polysilicon.

Thus, as can be appreciated from above, the present disclosure provides a split gate flash memory cell device. A semiconductor substrate includes a first source/drain region and a second source/drain region. A select gate and a memory gate are spaced over the semiconductor substrate between the first and second source/drain regions. A line-shaped charge trapping dielectric structure is arranged between the semiconductor substrate and the memory gate.

In other embodiments, the present disclosure provides a method for manufacturing a split gate flash memory cell device. A charge trapping dielectric layer and a memory gate layer are formed over a semiconductor substrate. A first etch is performed through the charge trapping dielectric layer to form a memory gate and to form a line-shaped charge trapping dielectric structure between the memory gate and the semiconductor substrate. A conformal select gate layer is formed over the charge trapping dielectric structure and the memory gate. A second etch is performed through the select gate layer to form a select gate over the semiconductor substrate adjacent to the memory gate.

In yet other embodiments, the present disclosure provides a method for manufacturing a split gate flash memory cell device. A memory gate is formed over a semiconductor substrate. A line-shaped charge trapping dielectric structure is formed between the memory gate and the semiconductor substrate. A select gate is formed over the semiconductor substrate adjacent to the memory gate.

In yet other embodiments, the present disclosure provides a pair of split gate flash memory cell devices. A semiconductor substrate includes a first source/drain region, a second source/drain region, and a third source/drain region arranged between the first and second source/drain regions. First and second memory gates correspond to the first and second source/drain regions and are arranged between the corresponding source/drain regions and the third source/drain region. First and second charge trapping dielectric structures correspond to the first and second memory gates. The charge trapping dielectric structures are line-shaped and arranged between the corresponding memory gates and the semiconductor substrate. First and second select gates correspond to the memory gates and are laterally arranged between the corresponding memory gates and the third source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A split gate flash memory cell device, comprising:
   a semiconductor substrate including a first source/drain region and a second source/drain region;
   a select gate and a memory gate spaced over the semiconductor substrate between the first and second source/drain regions;
   a line-shaped charge trapping dielectric structure arranged between the semiconductor substrate and the memory gate; and
   a sidewall layer laterally spaced from the select and memory gates, and confined to sidewalls of spacer layers laterally spacing the sidewall layer from the select and memory gates;
   wherein the line-shaped charge trapping dielectric structure includes:
      a tunneling structure;
      a memory gate dielectric structure arranged over the tunneling structure; and
      a charge storage structure arranged over the tunneling structure between the tunneling structure and the memory gate dielectric structure.

2. The split gate flash memory cell device according to claim 1, further including:
   an inter-gate spacer arranged between neighboring sidewalls of the select and memory gates.

3. The split gate flash memory cell device according to claim 1, wherein the line-shaped charge trapping dielectric structure begins approximately even with a first sidewall of the memory gate, extends linearly towards a second sidewall of the memory gate opposite the first sidewall, and ends approximately even with the second sidewall.

4. The split gate flash memory cell device according to claim 1, wherein the tunneling and memory gate dielectric structures includes oxides, and the charge storage structure includes a nitride layer or a plurality of silicon dots.

5. The split gate flash memory cell device according to claim 1, further including:
an inter-layer dielectric (ILD) structure arranged over and surrounding the select and memory gates, and the line-shaped charge trapping dielectric structure; and
conductive contacts extending through the ILD structure to the first and second source/drain regions.

6. The split gate flash memory cell device according to claim 1, further comprising:
a spacer layer arranged on opposing sidewalls of the line-shaped charge trapping dielectric structure and the memory gate, and laterally spacing the select gate from the memory gate; and
a dielectric layer confined directly under the spacer layer and the memory gate;
wherein the line-shaped charge trapping dielectric structure includes a region of the dielectric layer that is directly under the memory gate.

7. The split gate flash memory cell device according to claim 1, wherein the select gate and the memory gate have substantially co-planar upper surfaces.

8. A method for manufacturing a split gate flash memory cell device, the method comprising:
forming a charge trapping dielectric layer and a memory gate layer over a semiconductor substrate;
performing a first etch through the charge trapping dielectric layer to form a memory gate and to form a line-shaped charge trapping dielectric structure between the memory gate and the semiconductor substrate;
forming a conformal select gate layer over the line-shaped charge trapping dielectric structure and the memory gate; and
performing a second etch through the conformal select gate layer to form a select gate over the semiconductor substrate adjacent to the memory gate.

9. The method according to claim 8, further including:
forming the memory gate simultaneously with a second memory gate, the memory gate and the second memory gate spaced over the semiconductor substrate with a central region between the memory gate and the second memory gate;
forming the line-shaped charge trapping dielectric structure simultaneously with a second charge trapping dielectric structure, the second charge trapping dielectric structure being line-shaped and arranged between the second memory gate and the semiconductor substrate; and
forming the select gate simultaneously with a second select gate in the central region on opposite sides of the central region, the select gate adjacent to the memory gate and the second select gate adjacent to the second memory gate.

10. The method according to claim 8, further including:
forming an inter-gate spacer between neighboring sidewalls of the select and memory gates.

11. The method according to claim 8, further including:
forming the line-shaped charge trapping dielectric structure beginning approximately even with a first sidewall of the memory gate, extending linearly towards a second sidewall of the memory gate opposite the first sidewall, and ending approximately even with the second sidewall.

12. The method according to claim 8, further including:
forming a tunneling layer, a charge storage layer, a memory gate dielectric layer, and the memory gate layer over the semiconductor substrate in that order; and
performing a first sub-etch through the tunneling, charge storage, memory gate dielectric, and memory gate layers to form the memory gate.

13. The method according to claim 12, further including:
performing a second sub-etch through the tunneling layer to form the line-shaped charge trapping dielectric structure.

14. The method according to claim 12, further including:
forming the tunneling layer and the memory gate dielectric layers with oxides; and
forming the charge storage layer with a nitride or a plurality of silicon dots.

15. The method according to claim 8, further including:
forming the line-shaped charge trapping dielectric structure and the memory gate with continuous sidewalls.

16. The method according to claim 8, further including:
forming a select gate dielectric structure between the semiconductor substrate and the select gate; and
forming the select gate dielectric structure and the select gate with continuous sidewalls.

17. The method according to claim 8, further including:
forming a first source/drain region in the semiconductor substrate adjacent to the memory gate and a second source/drain region in the semiconductor substrate adjacent to the select gate;
forming an inter-layer dielectric (ILD) structure over and surrounding the select and memory gates, and the line-shaped charge trapping dielectric structure; and
forming conductive contacts extending through the ILD structure to the first and second source/drain regions.

18. A method for manufacturing a split gate flash memory cell device, the method comprising:
forming a memory gate over a semiconductor substrate;
forming a line-shaped charge trapping dielectric structure between the memory gate and the semiconductor substrate, wherein forming the line-shaped charge trapping dielectric structure comprises forming a plurality of layers that are stacked between the memory gate and the semiconductor substrate and that are confined directly under the memory gate;
forming a select gate over the semiconductor substrate adjacent to the memory gate;
forming a sidewall layer laterally spaced from the select and memory gates, and confined to sidewalls of spacer layers laterally spacing the sidewall layer from the select and memory gates; and
performing a planarization into the memory gate and the select gate to co-planarize upper surfaces of the memory gate and the select gate.

19. The method according to claim 18, wherein forming the line-shaped charge trapping dielectric structure comprises:
forming a tunneling structure;
forming a charge storage structure over the tunneling structure; and
forming a memory gate dielectric structure over the charge storage structure.

20. The method according to claim 18, further comprising:
forming a spacer layer on opposing sidewalls of the line-shaped charge trapping dielectric structure and the memory gate, and laterally spacing the select gate from the memory gate; and
forming a dielectric layer confined directly under the spacer layer and the memory gate;
wherein the line-shaped charge trapping dielectric structure includes a region of the dielectric layer that is directly under the memory gate.

* * * * *